United States Patent Office 3,677,754

Patented July 18, 1972

3,677,754

PHOTOSENSITIVE ELEMENT COMPRISING LIGHT-SENSITIVE POLYMERS AND PROCESS OF USING

John A. Ford, Jr., Robert C. McConkey, and Thomas M. Laakso, Rochester, N.Y., assignors to Eastman Kodak Company, Rochester, N.Y.

No Drawing. Original application Aug. 1, 1969, Ser. No. 846,952, now Patent No. 3,627,732. Divided and this application Feb. 16, 1971, Ser. No. 115,689

Int. Cl. G03c *1/68*

U.S. Cl. 96—35.1 6 Claims

ABSTRACT OF THE DISCLOSURE

There is described a novel class of light-sensitive polyesters containing a 1-arylmethylidyne-3-indenecarboxylate group or a 5-arylmethylidyne - 3 - furanonecarboxylate group as an integral part of the polymer backbone. The polymers are insolubilized upon exposure to actinic radiation and are useful in the preparation of photomechanical images.

This is a division of U.S. patent application Ser. No. 846,952, Light-Sensitive Polymers, now Pat. No. 3,627,-732.

This invention relates to photographic reproduction. In a particular aspect it relates to novel light-sensitive polymers and the use of such polymers in the preparation of photographic and photomechanical images.

It is known in the photographic art to reproduce images by processes which involve imagewise exposure of a coating of a radiation-sensitive material to modify the physical characteristics of the material in areas of the coating which have been exposed. Among the radiation-sensitive materials which have been used in such processes are light-sensitive polymers which are insolubilized or hardened on exposure to actinic radiation. The difference between exposed and unexposed areas can be employed to prepare images by such procedures as application of mechanical pressure, application of heat, treatment with solvents, and the like. Thus, the coating can be treated with a solvent for the unhardened polymer, which is a non-solvent for the hardened polymer, thereby removing unhardened polymer from the coating and leaving an image of hardened polymer. Alternatively, the coating can be heated to a temperature which is between the tackifying point of the material in unexposed areas of the coating and material in exposed areas of the coating so that the lower melting material can be toned with a colored powder or transferred to a receiving surface. Such processes have been employed to prepare lithographic printing plates, stencils, photoresists, and similar photographic and photomechanical images.

The different applications in which light-sensitive polymers are used require that such polymers be available with a variety of photographic and physical characteristics. Thus, there is a continual search for novel light-sensitive polymers which improve upon and differ from existing light-sensitive polymers.

It is an object of this invention to provide a novel class of light-sensitive polyesters having a wide range of spectral response.

It is another object of this invention to provide a novel class of light-sensitive polyesters which can be used in a variety of photographic and photothermographic reproduction processes.

It is a further object of this invention to provide photosensitive compositions and elements containing this novel class of light-sensitive polyesters.

It is yet a further object of this invention to provide processes for preparing photomechanical images employing this novel class of light-sensitive polyesters.

The above and other objects of this invention will become apparent to those skilled in the art from the further description of the invention which follows.

We have found a novel class of light-sensitive polyesters which have physical and photographic properties that make them desirable for use in a wide range of photographic and photothermographic reproduction processes. When crosslinked, these polyesters withstand highly acidic etching baths used in certain photomechanical processes. They adhere well to metals and other materials on which they are coated. Additionally, these polyesters are sensitive to a broad region of the visible spectrum, even in the absence of a sensitizer.

In accordance with the present invention there is provided a novel class of light-sensitive polyesters which contains as an integral part of the polymer backbone a light-sensitive moiety which is a 1-arylmethylidyne-3-indenecarboxylate group or a 5-arylmethylidyne-3-furanonecarboxylate group. Polyesters of this invention can be homopolyesters prepared from a single diacid, or its bis-ester, containing the light-sensitive moiety condensed with one or more organic diols, or the polyesters can be copolyesters prepared from one or more diacids or bis-esters containing the light-sensitive moiety and one or more modifying diacids or bis-esters of diacids condensed with one or more organic diols.

Typical diacids or their bis-esters containing the light-sensitive 1-arylmethylidyne-3-indenecarboxylate or 5-arylmethylidyne-3-furanonecarboxylate moiety which can be employed in preparing light-sensitive polyesters of the present invention can be represented by the following structural formula:

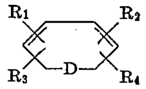

wherein D represents the atoms necessary to complete a benzene or a furane nucleus, i.e., D represents a —CH=CH—, or an —O— group; $R_1$ and $R_2$ are each independently a hydrogen atom, a halogen atom, a lower alkyl group of 1 to 4 carbon atoms (e.g., methyl, ethyl, propyl, butyl), a lower alkoxy group having 1 to 4 carbon atoms (e.g. methoxy, ethoxy, propoxy, butoxy), a lower dialkylamino group, the alkyl moieties of which each have 1 to 5 carbon atoms, a heterocyclic group containing a hetero nitrogen atom and typically having 5 to 6 atoms in the hetero ring (e.g. pyrrolidino, piperidino, morpholino, etc.); $R_3$ is a 1-methylidyne-3-indenecarboxylate group or a 5-methylidyne-3-furanonecarboxylate group having the formulae:

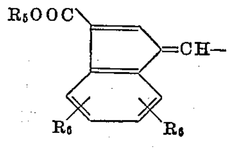

and

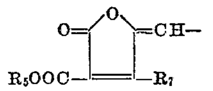

$R_4$ is an $R_3$ group or an alkoxycarbonyl or alkoxycarbonylvinyl group having the formula:

$$R_5OOC\text{+}CH{=}CR_8\text{+}_n$$

$R_5$ is a hydrogen atom or a lower alkyl group having 1 to 8 carbon atoms (e.g., methyl, ethyl, propyl, butyl, amyl, hexyl, heptyl, octyl, etc.); $R_6$ is a hydrogen atom, a lower alkyl group having 1 to 8 carbon atoms or a lower alkoxy group having 1 to 8 carbon atoms; $R_7$ is an aryl group such as a phenyl group, including a phenyl group substituted with such substituents as an alkyl group of 1 to 8 carbon atoms, an alkoxy group of 1 to 8 carbon atoms, an alkoxycarbonyl group of 2 to 9 carbon atoms, a nitro group, a halogen group, etc., a naphthyl group, including a naphthyl group substituted with 1 or more of the above-named substituents; $R_8$ is a hydrogen atom or a cyano group; *n* is 0 or 1 when D is a —CH═CH— group, and *n* is 1 when D is an —O— group.

Representative dicarboxylic acid bis-esters which can be employed to prepare photosensitive polyesters of the present invention, include:

arylenedimethylidyne-bis(3-indenecarboxylates) such as:

dimethyl 1,3-phenylenedimethylidyne-1,1′-bis(3-indenecarboxylate),
diethyl 1,4-phenylenedimethylidyne-1,1′-bis(3-indenecarboxylate),
dimethyl 4-dimethylamino-6-methyl-1,3-phenylenedimethylidyne-1,1′-bis(3-indenecarboxylate),
dimethyl 4-dimethylamino-6-methyl-1,3-phenylenedimethylidyne-1,1′-bis(4,7-dimethyl-3-indenecarboxylate),
dimethyl 1,3-phenylenedimethylidyne-1,1′-bis(4,7-dimethyl-3-indenecarboxylate),
dimethyl 1,4-phenylenedimethylidyne-1,1′-bis(4,7-dimethyl-3-indenecarboxylate),
dibutyl 4-pyrrolidino-1,3-phenylenedimethylidyne-1,1′-bis(3-indenecarboxylate),
dimethyl 4,6-dibutoxy-1,3-phenylenedimethylidyne-1,1′-bis(3-indenecarboxylate),
diethyl 3-diethylamino-1,4-phenylenedimethylidyne-1,1′-bis(4,7-diethoxy-3-indenecarboxylate),
dimethyl 2,5-furylenedimethylidyne-1,1′-bis(3-indenecarboxylate),
dimethyl 2,4-furylenedimethylidyne-1,1′-bis(3-indenecarboxylate),
dimethyl 2,5-furylenedimethylidyne-1,1′-bis(4,7-dimethyl-3-indenecarboxylate),
dimethyl 4-dimethylamino-2,5-furylenedimethylidyne-1,1′-bis(4,7-dimethyl-3-indenecarboxylate),
dimethyl 2,4-furylenedimethylidyne-1,1′-bis(4,7-diethoxy-3-indenecarboxylate);

arylenedimethylidyne-bis[2(5H)-furanone-3-carboxylates] such as:

1,3-phenylenedimethylidyne-5,5′-bis[3-methoxycarbonyl-4-phenyl-2(5H)-furanone],
1,4-phenylenedimethylidyne-5,5′-bis[3-ethoxycarbonyl-4-phenyl-2(5H)-furanone],
4-dimethylamino-6-methyl-1,3-phenylenedimethylidyne-5,5′-bis[3-methoxycarbonyl-4-phenyl-2(5H)-furanone],
1,3-phenylenedimethylidyne-5,5′-bis[3-butoxycarbonyl-4-phenyl-2(5H)-furanone],
1,3-phenylenedimethylidyne-5,5′-bis[3-propoxycarbonyl-4-(p-nitrophenyl)-2(5H)-furanone],
2,5-furylenedimethylidyne-5,5′-bis[3-methoxycarbonyl-4-phenyl-2(5H)-furanone];

1-(alkoxycarbonylarylidene)-3-indenecarboxylates such as:

methyl 1-(4-methoxycarbonylbenzylidene)-3-indenecarboxylate,
methyl 1-[4-(2-methoxycarbonylvinyl)benzylidene]-3-indenecarboxylate,
methyl 1-[4-(2-methoxycarbonylvinyl)benzylidene]-4,7-dimethyl-3-indenecarboxylate,
ethyl 1-(3-ethoxycarbonylbenzylidene)-3-indenecarboxylate,
methyl 1-(3-methoxycarbonyl-4-dimethylamino-6-methylbenzylidene)-3-indenecarboxylate,
ethyl 5-(3-methoxycarbonyl-1-indenylidenemethyl) furfurylidenecyanoacetate,
methyl 1-[5-(2-methoxycarbonylvinyl)furfurylidene]-3-indenecarboxylate,
methyl 4,7-dimethyl-1-[5-(2-carbonylvinylfurfurylidene]-3-indenecarboxylate; and 5-(alkoxycarbonylarylidene)-2(5H)-furanone-3-carboxylate such as:

3-methoxycarbonyl-5-[4-methoxycarbonylbenzylidene]-4-phenyl-2(5H)-furanone,
3-methoxycarbonyl-5-[4-(2-methoxycarbonylvinyl) benzylidene]-4-phenyl-2(5H)-furanone,
3-methoxycarbonyl-5-[4-(2-methoxycarbonylvinyl) benzylidene]-4-phenyl-2(5H)-furanone,
3-ethoxycarbonyl-5-(3-ethoxycarbonylbenzylidene)-4-phenyl-2(5H)-furanone,
3-methoxycarbonyl-5-[3-methoxycarbonyl-4-dimethylamino-6-methylbenzylidene]-4-phenyl-2(5H)-furanone.

The phenylenedimethylidyne - 3-indenecarboxylic acids and esters are conveniently prepared by condensation of a 3-indenecarboxylic acid or ester with an appropriate aromatic dialdehyde. The 2(5H)-furanone-3-carboxylic acids are susceptible to decarboxylation and hence it is preferred to employ the 2(5H)-furanone-3-carboxylic acid esters in this condensation reaction to prepare alkyl phenylenedimethylidyne-2(5H)-furanone esters. Bis-esters containing the furan nucleous can be prepared by condensation of the appropriate indene or furanone carboxylic acid or carboxylic acid ester with 2-furaldehyde, formylation of the resulting acid or ester and then condensation of the aldehyde obtained with the same or a second carboxylic acid or acid ester.

The organic diols which are condensed with bis-esters containing the light-sensitive moiety to prepare light-sensitive polyesters of the present invention can be represented by the following structural formula:

(II) $$HO{-}R_9{-}OH$$

wherein $R_9$ is a divalent organic group having about 2 to 20 carbon atoms such as a divalent hydrocarbon group such as an aliphatic alkylene group (e.g., ethylene, propylene, isopropylene, butylene, pentylene, hexylene, 2,2-dimethylpropylene, heptylene, octylene, 2 - ethylhexylene, nonylene, decylene, dodecylene, etc.), an arylene group (e.g., phenylene, bisphenylene alkylene, etc.), a cycloalkylene group (e.g., norbornylene, cyclohexylene, 1,4-dialkylenecyclohexylene, etc.); an ether group such as an alkylene-O-alkylene group, an alkylene-O-cyclohexylene-O-alkylene group, etc.; and the like.

Exemplary diols include ethylene glycol, diethylene glycol, 1,3-propanediol, 1,4-butanediol, 1,5-pentanediol, 1,6-hexanediol, 1,7 - heptanediol, 1,8-octanediol, 1,9-nonanediol, 1,10-decanediol, 1,12-dodecanediol, neopentyl glycol, 2,2-bis-4-hydroxyphenylpropane, norboranediol, 1,4-cyclohexanedimethanol, 1,4-di-β-hydroxyethoxycyclohexane, etc.

The light-sensitive polyesters of the present invention can be copolyesters and contain in addition to the light-sensitive indene or furanone group, groups derived from one or more additional or modifying dicarboxylic acids.

The modifying dicarboxylic acid can be one which itself will give a light-sensitive polyester, such as a dicarboxylic acid containing the vinyl ketone group (e.g., p-phenylenediacrylic acid, fumaric acid, cinnamylidenemalonic acid, muconic acid, etc.), or it can be a non-light-sensitive dicarboxylic acid such as malonic acid, succinic acid, glutaric acid, adipic acid, pimelic acid, suberic acid, azelaic acid, sebacic acid, dodecanedioic acid, brassylic acid, $\alpha,\beta$-diethylsuccinic acid, $\alpha$-butyl-$\alpha$-ethyl glutaric acid, terephthalic acid, isophthalic acid, etc., as well as mixtures of such dicarboxylic acids. Such modifying dicarboxylic acids, when employed, preferably provides from 25 to 75 percent of the dicarboxylate units in the polyester; although when the modifying dicarboxylic acid is one which itself will give a light-sensitive polyester, such modifying units can comprise up to 99 percent of the dicarboxylate units in the polyester.

Such modifying dicarboxylic acids can be represented by the structural formula:

$$R_5O\overset{O}{\overset{\|}{C}}-R_{10}-\overset{O}{\overset{\|}{C}}OR_5$$

wherein $R_5$ is as defined above and $R_{10}$ is a divalent organic group, for example a divalent saturated or unsaturated hydrocarbon group such as an alkylene group (e.g., methylene, ethylene, propylene, butylene, amylene, hexylene, heptylene, octylene, nonylene, decylene, undecylene, dodecylene, etc.), including substituted alkylene groups such as aralkylene groups (e.g., benzylidene, phenylethylene, phenylenedimethylene, etc.); an arylene group (e.g., phenylene, biphenylene, naphthylene, etc.), including substituted arylene groups such as alkarylene groups (e.g., methylphenylene, ethylphenylene, propylnaphthylene, etc.); an alkylene group (e.g., vinylene, propenylene, butenylene, 1,3-butadienylene, hexenylene, 1,3 - hexadienylene, 2,4-hexadienylene, etc.), including substituted alkenylene groups, such as aralkenylene groups (e.g., phenylenedivinylene), and an alkenyldiene group (e.g., butenylidene), including substituted alkenylidene groups such as aralkenylidene groups (e.g., 1 - phenyl - 1,3-butadien-4-ylidene).

Copolyesters containing more than one light-sensitive acid moiety are especially preferred in view of the unexpected extension of spectral sensitivity obtained by such combination. Thus, a copolyester prepared from a cinnamylidenemalonate and a phenylenedimethylidyne-bis-indenecarboxylate are sensitive to radiation well into the viable region of the spectrum whereas homopolymers prepared from these dicarboxylic acids as well as mixtures of homopolymers are not as sensitive to visible radiation.

Typically the polyesters of this invention are prepared by a polycondensation reaction between a diol and a bis-ester of a dicarboxylic acid. Useful catalysts for this reaction are titanium esters such as titanium isopropoxide and tetraalkyltitanates, strontium oxide, zinc acetate, magnesium titanium esters, and the like.

By the proper choice of glycols and bis-esters the physical properties of the polyesters of the present invention can be varied from a soft rubbery to a hard glossy amorphous material or a crystalline material. Thus, the polyesters of this invention are useful in a wide variety of photographic and photothermographic image reproduction processes.

Coating compositions containing the light-sensitive polymers of this invention can be prepared by dispersing or dissolving the polymer in a suitable organic solvent such as dimethylformamide; ketones such as 4-methyl-2-pentanone, cyclohexanone, etc.; chlorinated hydrocarbon solvents such as chloroform, trichloroethylene, dichloroethane, trichloroethane, tetrachloroethane, etc.; mixtures of these solvents, and the like. Coating compositions can include a variety of photographic addena utilized for their known purpose, such as agents to modify the flexibility of the coating, agents to modify its surface characteristics, dyes and pigments to impart color to the coating, agents to modify the adhesivity of the coating to the support, and a variety of other addenda known to those skilled in the art.

The coating compositions can be sensitized with such sensitizers as pyrylium and thiapyrylium salts, thiazoles, benzothiazolines, naphthothiazolines, quinolizone, Michler's ketone, Michler's thioketone, and the like sensitizers. Because of the wide range of spectral response and high photographic speed of the light-sensitive polymers of the present invention, often it is not necessary, and for some applications not desirable, to incorporate sensitizers in the photosensitive coating composition. If, however, a sensitizer is employed, it can be present in amounts of about 0.005 to 5 percent by weight of the coating composition.

The light-sensitive polymer of this invention can be the sole polymeric constituent of the coating composition or another polymer can be incorporated therein to modify the physical properties of the composition and serve as a diluent. For example, phenolic resins, such as thermoplastic novolac resins, can be incorporated in the composition to improve the resistance of the polymer composition to etchants when it is used as a photoresist. Similarly, hydrophilic polymers such as cellulose and its derivatives polyalkylene oxides, polyvinyl alcohol and its derivatives, etc., can be incorporated in the composition to improve the hydrophilic properties of the coating when it is used in the preparation of lithographic printing plates. These other polymeric materials can constitute up to 25% by weight, based on the weight of the light-sensitive polymer of the coating composition.

Photosensitive elements can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as polyalkyl methacrylates, e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light-sensitive polymer employed, and the nature of other components which may be present in the coating. Typical coating thicknesses can be from about 0.1 to 10 mils.

Photomechanical images can be prepared with photosensitive elements by imagewise exposing the element to a light source to harden or insolubilize the polymer in exposed areas. Suitable light sources which can be employed in exposing the elements include sources rich in visible radiation and sources rich in ultraviolet radiation, such as carbon arc lamps, mercury vapor lamps, fluorescent lamps, tungsten lamps, photoflood lamps, and the like.

The exposed element can be developed with a solvent for the unexposed, uncrosslinked polymer which is a non-solvent for the exposed hardened polymer. Such solvents can be selected from the solvents listed above as suitable coating solvents as well as others.

In an alternate embodiment an image can be developed with the exposed elements by heating it to a temperature in the range of about 50 to 200° C., which is intermediate between the tackifying point of the polymer in unexposed and exposed areas, to soften or tackify the polymer in the unexposed areas. The softened polymer can then be toned or transferred to a receiving sheet under pressure and toned, or transferred without toning if a pigment, dye or color-forming compound is incorporated in the layer.

The following examples further illustrate this invention.

Example 1.—Dimethyl 4-dimethylamino-6-methyl-1,3-phenylenedimethylidyne-1,1'-bis(3-indenecarboxylate)

A solution of 19.1 g. (0.100 mole) of 6-dimethylamino-4-methylisophthalaldehyde, 34.8 g. (0.200 mole) of methyl 3-indenecarboxylate, 200 ml. of toluene, 1. ml. of piperidine, and 1 ml. of glacial acetic acid is refluxed for 2 hours with stirring and azeotropic removal of 3.6 ml. of water. The orange-red solution is cooled to room temperature and poured into 1 liter of ligroine (B.P. 63–75° C.). The resulting two-phase liquid is allowed to stand for 4 hours with occasional manual stirring. The lower layer is separated, boiled with 1 liter of acetonitrile and cooled overnight in the refrigerator. The product is collected, washed with acetonitrile and dried to give 18.2 g. of orange-red crystals, M.P. 197–200° C. Evaporation of the upper layer from the reaction mixture in the hood at room temperature gives a mixture of brown tar and orange-red crystals. Recrystallization using the acetonitrile filtrate from the first crop gives 15.1 g. of product, M.P. 198.5–201.5° C. The two crops are combined and recrystallized from 1.5 l. of acetonitrile to give 29.7 g. of orange-red crystals (59.0 percent), M.P. 199–201° C.

*Analysis.*—Calcd. for $C_{33}H_{29}NO_4$ (percent): C, 78.7; H, 5.76; N, 2.79. Found (percent): C, 78.9; H, 5.8; N, 3.0.

Example 2.—Preparation of poly[1,5-pentylene 4-dimethylamino-6-methyl-1,3-phenylenedimethylidyne-1,1'-bis(3-indenecarboxylate)]

Dry 1,5-pentanediol, 9 g. (0.086 mole), and 25.2 g. (0.05 mole) dimethyl 4-dimethylamino-6-methyl-1,3-phenylenedimethylidyne-1,1'-bis(3-indenecarboxylate) are weighed into a clean dry 50 ml. side arm flask. The side arm of the flask is fitted with a cork and the flask itself is fitted with a glass tube reaching the material in the flask so helium gas covers the reaction during the first stage of heating. The flask is also fitted with an efficient Vigreux column for refluxing high-boiling reagents, during the first heating stage, while allowing the generated alcohols to distill off. All reactants are melted by inserting the flask in a silicone oil bath held at 235° C. in subdued light. One drop of titanium isopropoxide is added to the homogeneous melt and the flask and contents are heated for 2 hours. After this time the first stage reaction is terminated and the Vigreux column, inert gas tube and the cork are removed and the side arm connected to a vacuum pump through two Dry Ice traps. A stainless steel stirrer, fitted with a ball joint, is inserted into the reaction melt to stir the polymer as the pressure is lowered to 0.08 mm. Hg. The polymer is stirred at this pressure for a total of 5 minutes and the second stage reaction is completed. A dark viscous melt is obtained which on cooling hardened to a hard red amorphous glass, having an inherent viscosity at 25° C. of 0.29 in 17:1 phenol: chlorobenzene solution. The unsensitized polymer has a sensitivity value of 2 using dichloroethane as both coating and developing solvent. The sensitivity value is a measure of photometric speed of the polymer relative to that of unsensitized poly(vinyl cinnamate) and is measured by the procedure of Minsk et al. "Photosensitive Polymers, I & II" Journal of Applied Polymer Science; vol. II, No. 6, pp. 302–311 (1959).

Example 3.—Preparation of poly[ethylene:tetramethylene terephthalate:cinnamylidenemalonate:4-dimethylamino-6-methyl-1,3-phenylenedimethylidyne-1,1'-bis(3-indenecarboxylate)]

This polyester is prepared by the procedure described in Example 2 using the following materials and reaction times:

11.5 g. (0.186 mole) dry ethylene glycol
1.0 g. (0.010 mole) dry 1,4-butanediol 8.2 g. (0.042 mole) dimethylterephthalate
19.7 g. (0.072 mole) diethyl cinnamylidenemalonate
3.0 g. (0.006 mole) dimethyl 4-dimethylamino-6-methyl-1,3-phenylenedimethylidyne-1,1'-bis(3-indenecarboxylate)
1 drop titanium isopropoxide
1st stage reaction time=3.5 hours
2nd stage reaction time=15 minutes The product is a hard, red amorphous glass. It has an inherent viscosity at 25° C. of 0.57 in a 1:1 phenol:chlorobenzene solution. The sensitometric properties are as follows:

| Sensitizer | Sensitivity value | Coating and developing solvents | Spectral response, mμ |
|---|---|---|---|
| None | 130 | Tetrachloroethane | 270–400 |
| A | 130 | | 270–400 |
| B | 130 | | 270–400 |
| C | 280 | | 270–440 |

NOTE.—The sensitizers in this and subsequent examples are employed in concentration of 0.2 percent by weight, and are identified as follows:
A=2,6-bis(p-ethoxyphenyl)-4-(p-n-amyloxyphenyl)thiapyrylium perchlorate.
B=2-benzoylmethylene-1-methyl-β-naphthothiazoline.
C=methyl 3-methyl-2-benzothiazolidinodithioacetate.
D=4-H-quinolizine-4-thione.

Example 4.—Preparation of poly[1,9-nonylene azelate: p-phenylenediacrylate:4-dimethylamine-6-methyl-1,3-phenylenedimethylidyne-1,1'-bis(3-indenecarboxylate)]

This polymer is prepared as described in Example 2 using the following chemicals and reaction times:

38.5 g. (0.24 mole) 1.9-nonanediol
21.0 g. (0.07 mole) diisobutyl azelate
18.8 g. (0.0686 mole) diethyl p-phenylenediacrylate
0.7 g. (0.0014 mole) dimethyl 4-dimethylamino-6-methyl-1,3-phenylenedimethylidyne-1,1'-bis(3-indenecarboxylate)
1 drop titanium isopropoxide
1st stage reaction time=3 hours
2nd stage reaction time=25 minutes The product is a tough waxy, crystalline, reddish-orange colored solid. It has an inherent viscosity at 25° C. of 0.5 in a 1:1 phenol:chlorobenzene solution. The sensitometric properties of this polymer are as follows:

| Sensitizer | Sensitivity value | Coating and developing solvents | Spectral response, mμ |
|---|---|---|---|
| None | 22 | Dichloroethane | 270–360 |
| A | 45 | | 270–360 |
| B | 63 | | 270–360 |
| C | 45 | | 270–360 |

Example 5.—Preparation of methyl 1-(p-methoxycarbonylbenzylidene)-3-indenecarboxylate A mixture of 25.4 g. (0.169 mole) of p-formylbenzoic acid, 29.4 g. (0.169 mole) methyl 3-indenecarboxylate, 1 ml. piperidine, 300 ml. toluene, and 1 ml. of glacial acetic acid is refluxed with stirring for 2 hours while removing water in a moisture trap. The mixture is cooled, collected by filtration, washed with toluene and dried at 60° C. A solution of the crude methyl 1-(p-carboxybenzylidene)-3-indenecarboxylate in 1500 ml. methanol is saturated with hydrogen chloride gas and stirred overnight at reflux. The mixture is cooled, the solid collected by filtration, washed with methanol, and dried to yield 36.9 g. of product, M.P. 152–6° C. The crude material is recrystallized twice from toluene to yield 33 g. of orange crystals melting at 153–156° C.

*Analysis.*—Calcd. for $C_{20}H_{16}O_4$ (percent): C, 75.0; H, 5.0. Found (percent): C, 75.5; H, 5.4.

Example 6.—Preparation of light-sensitive polyester from methyl 1 - (p - methoxycarbonylbenzylidene) - 3 - indenecarboxylate

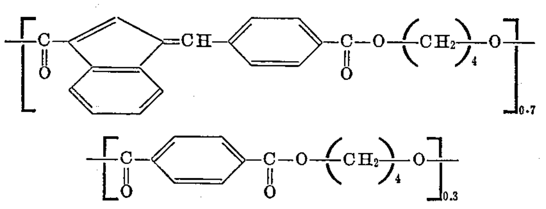

A mixture of 14 g. (0.044 mole) methyl 1-(p-methoxycarbonylbenzylidene) - 3 - indenecarboxylate, 3.7 g. (0.019 mole) dimethyl terephthalate, 8 g. (0.090 mole) butanediol and 2 drops of titanium butoxide are heated under nitrogen at 190° C. for 2.5 hours. The mixture is then stirred under vacuum until the pressure has been reduced to 250μ (about 75 minutes). The mixture becomes too viscous to stir. After cooling, sufficient trichloroethane is added to dissolve the polymer, the solution is filtered, and the filtrate poured into methanol to precipitate the polymer. The solid is collected by filtration, washed several times with fresh portions of methanol, and dried in a vacuum oven at 40° C., yield 18 g. The inherent viscosity in trichloromethane at 25° C. is 0.28.

Example 7.—Preparation of 3 - methoxycarbonyl-5-[p-(2 - methoxycarbonylvinyl)benzylidene - 4 - phenyl-2(5H)-furanone (A) A solution of 30 g. (0.138 mole) of 3-methoxycarbonyl - 4 - phenyl - 2(5H) - furanone, 24.2 g. (0.138 mole) of p-formylcinnamic acid, 0.5 ml. acetic acid, and 1.5 ml. piperidine in 250 ml. of toluene is refluxed with stirring in a flask attached to a Dean Stark trap for 1.5 hours during which time 2.3 ml. of water is collected. The mixture is cooled, the solid collected by filtration and recrystallized twice from 300 ml. portions of dioxane to yield 32.4 g. of 5-[p-(2-carboxyvinyl)benzylidene]-3-methoxycarbonyl - 4 - phenyl - 2(5H) - furanone melting at 252–4° C.

*Analysis*.—Calcd. for $C_{22}H_{16}O_6$ (percent): C, 70.3; H, 4.3. Found (percent): C, 69.8; H, 4.8.

(B) A cooled suspension of 55.2 g. (0.147 mole) of 5 - [p - (2 - carboxyvinyl)benzylidene] - 3 - methoxycarbonyl - 4 - phenyl - 2(5H) - furanone, prepared in Step A, in 500 ml. of methanol is saturated with hydrogen chloride gas and then heated at reflux for 16 hours. The solid is collected, dissolved in 500 ml. acetonitrile, filtered, and the filtrate cooled in a refrigerator. The solid again is collected by filtration and recrystallized from acetonitrile. A second crop is obtained by concentrating the mother liquors to provide a total yield of 20.9 g., M.P. 196–8° C.

*Analysis*.—Calcd. for $C_{23}H_{18}O_6$ (percent): C, 70.9; H, 4.7. Found (percent): C, 70.5; H, 4.7.

Example 8.—Preparation of light-sensitive polyester from 3-methoxy carbonyl-5-[p-(2-methoxycarbonylvinyl)benzylidene]-4-phenyl-2(5H)-furanone

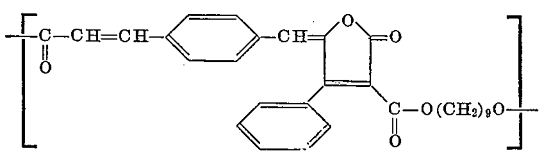

A mixture of 9.6 g. (0.060 mole) 1,9-nonanediol and 13.7 g. (0.035 mole) of 3-methoxycarbonyl-5-[p-(2-methoxycarbonylvinyl)benzylidene] - 4 - phenyl-2(5H)-furanone is placed in a polymerization flask, fitted with an air condenser (Vigreux column) and heated, under a helium atmosphere and subdued light, in an oil bath to 235° C. One drop of titanium isopropoxide is added when the mixture becomes a homogeneous melt. Heating is continued for 3 hours during which time most distillables are allowed to escape from the air condenser. The system is slowly placed under vacuum to remove the remaining distillable materials. The melt is poured from the flask and cooled to yield a brittle, glasslike, deep amber polymer. Inherent viscosity at 25° C. in a solvent mixture of 1:1 phenol:chlorobenzene is 0.36. A dilute solution of the polymer in dichloroethane is wash coated onto a glass plate and the plate exposed under a line negative to a 275 watt sunlamp for 4 minutes at a distance of about 5 inches. The exposed areas are visible as clear areas before development. The plate is developed by washing with dichloroethane. The unexposed areas wash away, while the exposed areas remain.

Example 9.—Preparation of dimethyl 1,3-phenylenedimethylidyne-1,1'-bis(4,7-dimethyl-3-indenecarboxylate)

A solution of 44 g. (0.22 mole) methyl 4,7-dimethyl-3-indenecarboxylate, 13.4 g. (0.100 mole) isophthaladehyde and 200 ml. benzene is treated with 1 ml. of glacial acetic acid and 1 ml. piperidine and heated overnight under a moisture trap to collect 3.5 ml. of water. The mixture is concentrated under vacuum to yield a yellow solid residue. The residue is recrystallized once from 350 ml. of ethyl acetate, and a second time from 200 ml. of ethyl acetate. Yield 37.6 g. of yellow solid melting at 136–138.5° C.

*Analysis*.—Calcd. for $C_{34}H_{30}O_4$ (percent): C, 81.3; H, 5.98. Found (percent): C, 80.9; H, 6.2.

Example 10.—Preparation of a light-sensitive polymer from dimethyl 1,3-phenylenedimethylidyne-1,1'-bis-(4,7-dimethyl-3-indenecarboxylate)

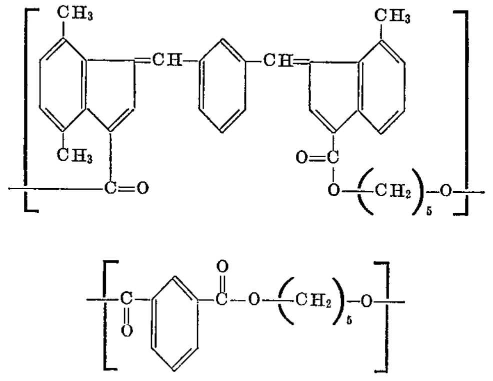

A mixture of 18.0 g. (0.172 mole) of 1,5-pentanediol, 9.7 g. (0.05 mole) dimethyl isophthalate and 25.1 g. (0.05 mole) of dimethyl 1,3-phenylenedimethylidyne-1,1'-bis(4,7-dimethyl-3-indenecarboxylate) is heated in an oil bath under a nitrogen atmosphere in a 100 ml. flask fitted with an air condenser (Vigreux column). One drop of titanium isoyropoxide is added when the mixture becomes a homogeneous melt, and the melt is heated at 235° C. for 2.25 hours during which time most of the distillable material is allowed to escape from the condenser. A vacuum is applied slowly until the pressure is reduced to about 0.07 mm. of mercury, and the melt is maintained under vacuum for about 24 minutes. The melt is poured from the flask and cooled to provide a dark red, glass-like solid having an inherent viscosity at 25° C. in 1:1 phenol:chlorobenzene of 0.49.

Example 11.—Preparation of methyl p-(4,7-dimethyl-3-methoxycarbonyl-1-indenylidenemethyl)cinnamate (A) A mixture of 45.8 g. (0.227 mole) of 4,7-dimethyl-3-methoxycarbonylindene, 40.0 g. (0.227 mole) of p-formylcinnamic acid, 1 ml. of glacial acetic acid, 1 ml. of piperidine, and 500 ml. of toluene is refluxed for 2 hours in a flask fitted with a Dean Stark moisture trap, and then is allowed to stand for about 16 hours. A total of 2.8 ml. of water is collected. The solid is collected by filtration and recrystallized from 400 ml. of glacial acetic acid to yield 37.7 g. of p-(4,7-dimethyl-3-methoxycarbonyl-1-indenylidenemethyl)cinnamic acid melting at 185–188° C.

(B) A mixture of 16.8 g. (0.0466 mole) of the acid prepared in part A above, 500 ml. of methanol, 1 g. p-toluenesulfonic acid, and 2.5 g. of a crude mixture of the above acid (part A) and its acid chloride is stirred at reflux for 24 hours, gravity filtered, and allowed to cool to room temperature. The precipitated product is collected by filtration, washed with methanol and dried to yield 10.7 g. of yellow solid melting at 107–117° C. A second crop is obtained by concentrating the mother liquors. The combined crops are recrystallized first form 500 ml. of cyclohexane, and then from 250 ml. of ethanol to provide 8.8 g. of product melting at 123–124° C.

*Analysis.*—Calcd. for $C_{24}H_{20}O_4$ (percent): C, 77.0; H, 5.9. Found (percent): C, 76.7; H, 6.2.

Example 12.—Preparation of a light-sensitive polymer from methyl p-(4,7-dimethyl-3-methoxycarbonyl-1-indenylidenemethyl)cinnamate

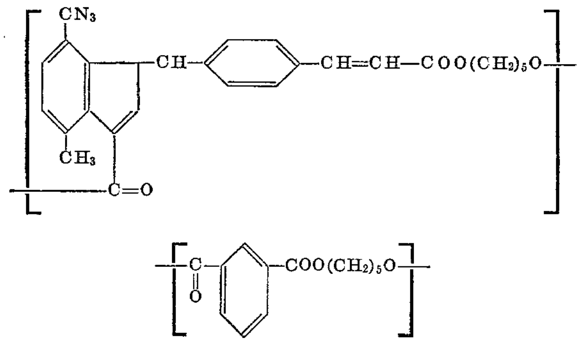

This polyester is prepared from 8.9 g. (0.086 mole) of 1,5-pentanediol, 5.8 g. (0.03 mole) dimethyl isophthalate and 7.5 g. (0.02 mole) methyl p-(4,7-dimethyl-3-methoxycarbonyl-1-indenylidenemethyl)cinnamate by the procedure described in Example 10 above. A bright red, tough, glass-like solid having an inherent viscosity at 25° C. in 1:1 phenol:chlorobenzene of 0.53 is obtained.

Example 13.—Preparation of dimethyl 4-dimethylamino-6-methyl-1,3-phenylenedimethylidyne-1,1′-bis(4,7-dimethyl-3-indenecarboxylate)

A mixture of 21.9 g. (0.108 mole) methyl 4,7-dimethyl-3-indenecarboxylate, 10.8 g. (0.054 mole) 4-dimethylamino-6-methylisophthalaldehyde, 100 ml. benzene, 1 ml. glacial acetic acid and 1 ml. piperidine is refluxed for about 16 hours in a flask fitted with a moisture trap. The reaction mixture is cooled to room temperature and the orange-red product is separated by filtration, washed with 200 ml. of ligroine, and dried to yield 29 g. The crude material is recrystallized 3 times from 150 ml. portions of toluene to provide 23 g. of product melting at 214–216° C.

*Analysis.*—Calcd. for $C_{37}H_{37}NO_4$ (percent): C, 79.5; H, 6.6; N, 2.5. Found (percent): C, 79.5; H, 6.7; N, 2.4.

Example 14.—Preparation of a light-sensitive polymer from the dimethyl ester of Example 13

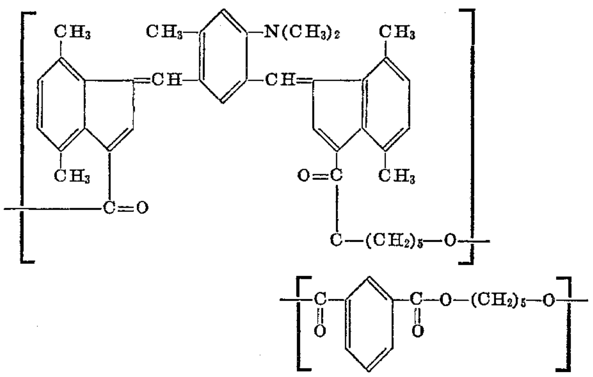

This polyester is prepared from 7.3 g. (0.07 mole) of 1,5-pentanediol, 3.9 g. (0.02 mole) dimethyl isophthalate, and 11.2 g. (0.02 mole) of the dimethyl ester prepared in Example 13 above by the procedure described in Example 10 above. A black-red, glass-like solid having an inherent viscosity at 25° C. of 0.64 in 1:1 phenol:chlorobenzene is obtained.

Examples 15–29.—Other light-sensitive polyesters

Using the procedure of Example 2, light-sensitive polyesters are prepared having the compositions listed below.

| Example No. | Glycol component(s) (mole percent) | Dicarboxylate component(s) (mole percent) |
|---|---|---|
| 15 | 1,9-nonanediol (100) | Diisobutylazelate (50), diethyl-p-phenylenediacrylate (49), 3-Methoxycarbonyl-5-[p-(2-methoxycarbonylvinyl)-benzylidene]-4-phenyl-2-(5H)-furanone (1). |
| 16 | do | Diisobutylazelate (75), dimethyl 4-dimethylamino-β-methyl-1,3-phenylenedimethylene-1,1′-bis-(3-indenecarboxylate) (25). |
| 17 | Ethylene glycol (95), 1,4-butanediol (5). | Dimethyl terephthalate (35), diethyl cinnamylidene-malonate (60), dimethyl 1,3-phenylenedimethylidyne-1,1′-bis-(3-indenecarboxylate) (5). |
| 18 | 1,4-butanediol (5), Ethylene glycol (95). | Dimethyl terephthalate (35), diethyl cinnamylidenemalonate (60), dimethyl 1,4-phenylenedimethylidyne-1,1′-bis-(3-indenecarboxylate) (5). |
| 19 | Ethylene glycol (95), 1,4-butanediol (5). | Dimethyl terephthalate (35), diethyl cinnamylidenemalonate (60), methyl 4-(3-methoxycarbonyl-1-indenylidenemethyl)cinnamate |
| 20 | 1,5-pentanediol (100) | Methyl 4-(3-methoxycarbonyl-1-indenylidenemethyl)cinnamate (100). |
| 21 | 1,3-propanediol (65), neopentyl glycol (35). | Diisobutyl sebacate (50), dimethyl 1,3-phenylenedimethylidyne-1,1′-bis-(3-indenecarboxylate) (50). |
| 22 | do | Di-n-butyl sebacate (50), dimethyl 1,4-phenylenedimethylidyne-1,1′-bis-(3-indenecarboxylate) (50). |
| 23 | 1,5-pentanediol (100) | Dimethyl isophthalate (50), methyl 4-(3-methoxycarbonyl-1-indenylidenemethyl)cinnamate (40), 6-methoxycarbonyl-2-(4-methoxycarbonylphenyl)-phthalimidine (10). |
| 24 | 1,10-decanediol (100) | Di-n-butyl sebacate (50), dimethyl 2,5-furylenedimethylidyne-1,1′-bis-(3-indencarboxylate) (50). |
| 25 | Ethylene glycol (95), 1,4-butanediol (5). | Dimethyl terephthalate (35), diethyl cinnamylidenemalonate (60), dimethyl 2,5-furylenedimethylidyne-1,1′-bis-(3-indenecarboxylate) (5). |
| 26 | 1,3-propanediol (65), neopentyl glycol (35). | Diisobutylazelate (65), diethyl p-phenylene-diacrylate (30), dimethyl 2,5-furylenedimethylidyne-1,1′-bis-(3-indenecarboxylate) (5). |
| 27 | 1,4-butanediol (100) | Dimethyl terephthalate (57), dimethyl bicyclo[2.2.1]-hept-2,5-diene-2,3-dicarboxylate (40), dimethyl 2,5-furylenedimethylidyne-1,1′-bis-(3-indenecarboxylate) (3). |
| 28 | 1,5-pentanediol (100) | Dimethyl isophthalate (60), methyl 4,7-dimethyl-1-(p-methoxycarbonylbenzylidene)-3-indenecarboxylate (40). |

TABLE—Continued

| Example No. | Glycol component(s) (mole percent) | Dicarboxylate component(s) (mole percent) |
|---|---|---|
| 29 | 1,4-(β-hydroxy-ethoxy)-cyclohexane (100) | Dimethyl isophthalate (70), 2,5-bis-(4-carbomethoxy-benzylidene) cyclopentanone (25), Dimethyl 4-dimethylamino-6-methyl-1,3-phenylenedimethylidyne-1,1'-bis-(4,7-dimethyl-3-indenecarboxylate) (5). |

Example 30

The photosensitive properties of polyesters prepared in the above examples are given in the following Table I.

TABLE I

| Polymer of Example No. | Inherent viscosity (a) | Sensitivity value using sensitizer | | | | | Coating solvent (b), developing solvent |
|---|---|---|---|---|---|---|---|
| | | None | A | B | C | D | |
| 6 | [2] 0.28 | 5.0 λmax 370(c) | 32 | 10 | -------- | 32 | DCE<br>DCE |
| 9 | [1] 0.36 | 130 λmax 386 | 45 | 32 | -------- | -------- | DCE<br>DCE |
| 15 | [1] 0.46 | 45 λmax 318 | 100 λmax 490 | 140 λmax 440 | -------- | 63 λmax 450 | DCE |
| 17 | [1] 0.81 | 32 λmax 326 | 14 λmax 500 | -------- | 22 λmax 360 | -------- | DCE<br>DCE |
| 18 | [1] 0.41 | 89 λmax 430 | 89 | -------- | 89 | -------- | DCE<br>DCE |
| 19 | [1] 0.64 | 250 λmax 400 | 790 | 360 | 1100 | 500 | DCE<br>DCE |
| 22 | [1] 0.53 | 63 λmax 426 | 63 | 63 | 89 | -------- | DCE<br>DCE |
| 26 | [1] 0.71 | 16 λmax 335 and 535 | 16 | -------- | 11 | -------- | DCE<br>$T_3CE$ |

(a) The solvents used in measuring the inherent viscosities are as follows:

[1] Phenol: chlorobenzene 1:1.

[2] Trichloromethane.

(b) The solvents used in coating and developing the elements are identified as follows:

DCE=1,2-dichloroethane.

MEK=Methyl ethyl ketone.

DMF=N,N-dimethylformamide.

$T_3CE$=Trichloroethane.

$T_4CE$=Tetrachloroethane.

(c) λmax indicates radiation having the longest wavelength, in nanometers, which will cause insolubilization of the polymer and sensitizer composition.

Example 31.—Use of a polyester of this invention as a lithographic material

The polyester of Example 3 is dissolved at 5 percent in tetrachloroethane and diluted to 2 percent with 1,2-dichloroethane for coating. An unsensitized coating is made on grained aluminum and a second coating is made with 0.04 percent of methyl 3-methyl-2-benzothiazolidine-dithioacetate sensitizer added to the polymer composition. Both coatings are dried and then exposed through a series of Wratten filters to a medium pressure mercury lamp for 20 seconds. Both coatings show effective insolubilization through the Wratten filter numbers 15, 58, 47, 32, and 23, indicating sensitivity from 270–580 mμ. The cinnamylidenemalonate homopolyesters are sensitive only to 400 mμ without the sensitizer and to 460 mμ with it. The ultraviolet and visible absorption curve on this polymer shows peaks at 325 mμ (abs.=1.97) characteristic of the cinnamylidenemalonate group, and at 477 mμ (abs.=0.14) characteristic of the phenylenedimethylidyne bis-3-indenecarboxylate group. Both the sensitized and unsensitized coatings are developed with dichloroethane to leave a brightly colored (reddish-brown) image which can then be dyed or can be etched with a desensitizing etch and rubbed up with a greasy lithographic ink to produce a usable negative-working lithographic printing plate.

The invention has been described in detail with particular reference to preferred embodiments thereof, but it will be understood that variations and modifications can be effected within the spirit and scope of the invention.

What is claimed is:

1. A photosensitive element which comprises a support bearing a layer of a light-sensitive, linear, film-forming polyester which contains recurring units derived from an organic diol and recurring units derived from a dicarboxylic acid bis-ester containing as an integral part of the polymer backbone a light-sensitive moiety selected from the group consisting of 1-arylmethylidyne-3-indenecarboxylate groups and 5-arylmethylidyne-3-furanonecarboxylate groups.

2. A process for preparing a photomechanical image which comprises the steps of (1) imagewise exposing to actinic radiation a photosensitive element which comprises a support bearing a layer of a light-sensitive, linear, film-forming polyester which contains recurring units derived from an organic diol and recurring units derived from a dicarboxylic acid bis-ester containing as an integral part of the polymer backbone a light-sensitive moiety selected from the group consisting of 1-arylmethylidyne-3-indenecarboxylate groups and 5 - arylmethylidyne-3-furanonecarboxylate groups, and (2) developing an image by removing polyester from the unexposed areas of the layer.

3. A process as defined in claim 2, wherein development of an image is effected by removing the unexposed polyester with a solvent therefor which is a non-solvent for the polyester in the exposed areas of the element.

4. A photosensitive element as defined in claim 1 wherein the dicarboxylic acid bi-ester is selected from the group consisting of arylenedimethylidyne-bis(3-indenecarboxylates), arylenedimethylidyne-bis[2(5H)furanone - 3 - carboxylates], 1 - (alkoxycarbonylarylidene) - 3 - indenecarboxylates and 5 - (alkoxycarbonylarylidene) - 2 (5H)-furanone-3-carboxylates.

5. A photosensitive element as defined claim 4 further comprising recurring units derived from a modifying dicarboxylic acid, said units comprising from 25 to 75 molo percent of the dicarboxylate units contained in the polymer backbone.

6. A photosensitive element as defined in claim 4 wherein the organic diol is an alkylene diol.

References Cited

UNITED STATES PATENTS

| | | | |
|---|---|---|---|
| 3,453,237 | 7/1969 | Borden et al. | 260—47 |
| 3,615,628 | 10/1971 | Mench et al. | 96—115 |

RONALD H. SMITH, Primary Examiner

U.S. Cl. X.R.

96—115 R